United States Patent
Ho et al.

(10) Patent No.: US 9,875,912 B2
(45) Date of Patent: Jan. 23, 2018

(54) CHIP PACKAGE AND MANUFACTURING METHOD THEREOF

(71) Applicant: XINTEC INC., Taoyuan (TW)

(72) Inventors: Yen-Shih Ho, Kaohsiung (TW); Hsiao-Lan Yeh, Tainan (TW); Chia-Sheng Lin, Taoyuan (TW); Yi-Ming Chang, Taoyuan (TW); Po-Han Lee, Taipei (TW); Hui-Hsien Wu, Taoyuan (TW); Jyun-Liang Wu, Taichung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/358,098

(22) Filed: Nov. 21, 2016

(65) Prior Publication Data

US 2017/0148694 A1    May 25, 2017

Related U.S. Application Data

(60) Provisional application No. 62/258,940, filed on Nov. 23, 2015.

(51) Int. Cl.
| | |
|---|---|
| *H01L 23/48* | (2006.01) |
| *H01L 23/52* | (2006.01) |
| *H01L 29/40* | (2006.01) |
| *H01L 21/56* | (2006.01) |
| *H01L 21/683* | (2006.01) |
| *H01L 21/78* | (2006.01) |
| *G06K 9/00* | (2006.01) |
| *H01L 23/31* | (2006.01) |

(52) U.S. Cl.
CPC .......... *H01L 21/561* (2013.01); *G06K 9/0004* (2013.01); *H01L 21/6836* (2013.01); *H01L 21/78* (2013.01); *H01L 23/3114* (2013.01); *H01L 23/481* (2013.01); *H01L 2224/16225* (2013.01)

(58) Field of Classification Search
CPC ... H01L 2924/16196; H01L 2224/8385; H01L 2224/83856; H01L 27/1462; H01L 23/3185
USPC ........ 257/787, 782, 704, 778; 438/108, 118, 438/124, 125, 126, 127
See application file for complete search history.

(56) References Cited

U.S. PATENT DOCUMENTS

| | | | |
|---|---|---|---|
| 6,414,385 B1 * | 7/2002 | Huang | H01L 23/3114 257/690 |
| 6,849,940 B1 * | 2/2005 | Chan | H01L 23/16 257/675 |
| 7,728,440 B2 * | 6/2010 | Honda | H01L 21/563 257/704 |

* cited by examiner

*Primary Examiner* — S. V. Clark
(74) *Attorney, Agent, or Firm* — Liu & Liu

(57) ABSTRACT

A chip package includes a chip, a first adhesive layer, a second adhesive layer, and a protection cap. The chip has a sensing area, a first surface, a second surface that is opposite to the first surface, and a side surface adjacent to the first and second surfaces. The sensing area is located on the first surface. The first adhesive layer covers the first surface of the chip. The second adhesive layer is located on the first adhesive layer, such that the first adhesive layer is between the first surface and the second adhesive layer. The protection cap has a bottom board and a sidewall that surrounds the bottom board. The bottom board covers the second adhesive layer, and the sidewall covers the side surface of the chip.

16 Claims, 8 Drawing Sheets

CHIP PACKAGE AND MANUFACTURING METHOD THEREOF

RELATED APPLICATIONS

This application claims priority to U.S. provisional Application Ser. No. 62/258,940, filed Nov. 23, 2015, which is herein incorporated by reference.

BACKGROUND

Field of Invention

The present invention relates to a chip package and a manufacturing method of the chip package.

Description of Related Art

When a chip package of a finger printing sensor is manufactured, a glass sheet is often utilized to cover the surface of the chip to protect the sensing area of the chip. In a typical chip package having a glass sheet, a dam element is disposed between the chip and the glass sheet, and thus the thickness of the dam element is the same as a distance between the glass sheet and the chip. In other words, the thickness of the dam element increases a gap between the glass sheet and the chip. When the sensing area receives an image, a flaring issue is prone to occur.

In manufacturing a finger printing sensor, if there is no glass sheet on a wafer that is not yet cut to form a plurality of chips and the wafer is thin, it is very difficult to move a wafer which has a ball grid array and a warpage issue of the wafer may be formed due to process limitations. In addition, the sensing area of the wafer is easily polluted during manufacturing processes, such that product yield is difficultly improved. Moreover, after a typical chip package is disposed on a printed circuit board, a side surface of the chip package is exposed, and may easily be damaged by an external force.

SUMMARY

An aspect of the present invention is to provide a chip package.

According to an embodiment of the present invention, a chip package includes a chip, a first adhesive layer, a second adhesive layer, and a protection cap. The chip has a sensing area, a first surface, a second surface that is opposite to the first surface, and a side surface that is adjacent to the first and second surfaces. The sensing area is located on the first surface. The first adhesive layer covers the first surface of the chip. The second adhesive layer is located on the first adhesive layer, such that the first adhesive layer is between the first surface of the chip and the second adhesive layer. The protection cap has a bottom board and a sidewall that surrounds the bottom board. The bottom board covers the second adhesive layer, and the sidewall covers the side surface of the chip.

An aspect of the present invention is to provide a manufacturing method of a chip package.

According to an embodiment of the present invention, a manufacturing method of a chip package includes the following steps. A first adhesive layer is used to adhere a carrier to a first surface of a wafer. The wafer and the carrier are cut to form at least one chip. The chip and the carrier that is on the chip are disposed on a printed circuit board. The carrier that is on the chip is removed. A protection cap that has a bottom board and a sidewall is provided, and the sidewall surrounds the bottom board. A second adhesive layer is formed on the first adhesive layer or the bottom board of the protection cap. The bottom board and the sidewall of the protection cap are utilized to respectively cover the second adhesive layer and a side surface of the chip, wherein the side surface is adjacent to the first surface and a second surface of the chip, and the second surface faces away from the first surface.

In the aforementioned embodiment of the present invention, since the protection cap of the chip package has the bottom board and the sidewall, and the bottom board of the protection cap covers the second adhesive layer that is on the first surface of the chip, and the sidewall of the protection cap covers the side surface of the chip, the first surface and the side surface of the chip may be protected by the protection cap. As a result, the strength of the entire chip package may be improved, such that the chip package is not easily damaged by an external force. Furthermore, in manufacturing the chip package, since the first surface of the wafer is adhered to the carrier through the first adhesive layer, even if the wafer is thin, the thin wafer is not limited by process limitations which cause a difficulty for a thin wafer to move, and a warpage issue is not prone to occur. In addition, before the chip is disposed on the printed circuit board in the manufacturing method of the chip package, the carrier is temporarily disposed on the wafer or on the chip that is formed by cutting the wafer, such that the sensing area of the chip is not easily polluted during manufacturing processes, thereby improving product yield.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
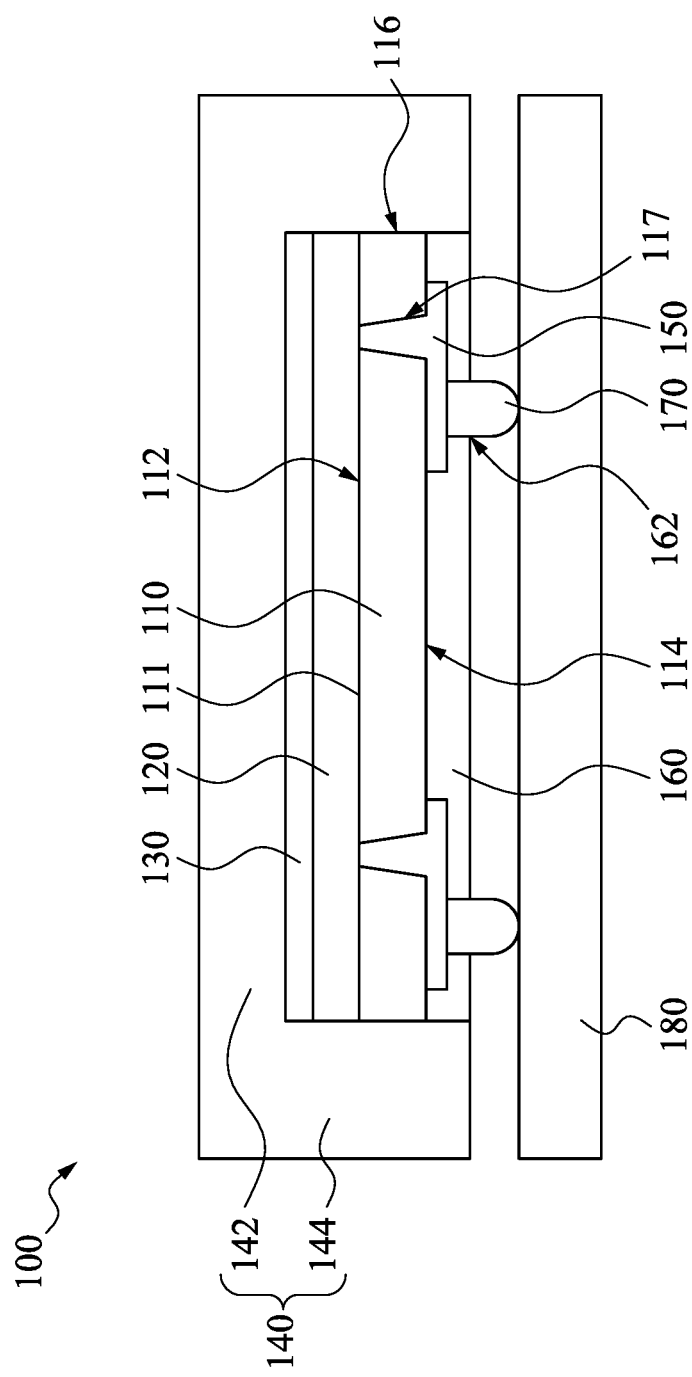
FIG. 1 is a cross-sectional view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a chip package 100 according to one embodiment of the present invention. As shown in FIG. 1, the chip package 100 includes a chip 110, a first adhesive layer 120, a second adhesive layer 130, and a protection cap 140. The chip 110 has a sensing area 111, a first surface 112, a second surface 114 that is opposite to the first surface 112, and a side surface 116 that is adjacent to the first and second surfaces 112, 114. The first surface 112 is the sensing surface of the chip 110, and the second surface 114 is the rear surface of the chip 110. The sensing area 111 is located on the first surface 112, and may be capable of sensing a fingerprint. The first adhesive layer 120 covers the first surface 112 of the chip 110. The second adhesive layer 130 is located on the first adhesive layer 120, such that the first adhesive layer 120 is disposed between the first surface 112 of the chip 110 and the second adhesive layer 130. The protection cap 140 has a bottom board 142 and a sidewall 144 that surrounds the bottom board 142. The bottom board 142 of the protection cap 140 covers the second adhesive layer 130, and the sidewall 144 of the protection cap 140 covers the side surface 116 of the chip 110.

In this embodiment, the chip package 100 may be a finger printing sensor, but the present invention is not limited in this regard. In addition, the chip package 100 may be disposed on a printed circuit board 180 to transmit information to other apparatuses.

Since the protection cap 140 of the chip package 100 has the bottom board 142 and the sidewall 144, and the bottom board 142 of the protection cap 140 covers the second adhesive layer 130 that is on the first surface 112 of the chip 110, and the sidewall 144 of the protection cap 140 covers the side surface 116 of the chip 110, the first surface 112 and the side surface 116 of the chip 110 may be protected by the protection cap 140. As a result, the strength of the entire chip package 100 may be improved, such that the chip package 100 is not easily damaged by an external force.

In this embodiment, the chip 110 has a through hole 117 that is present between the first and second surfaces 112, 114. The chip package 100 further includes a redistribution layer 150, a passivation layer 160, and a conductive structure 170. The redistribution layer 150 is located in the through hole 117 of the chip 110, and extends to the second surface 114 of the chip 110. The passivation layer 160 is located on the redistribution layer 150 and the second surface 114 of the chip 110, and has an opening 162 to expose a portion of the redistribution layer 150. The conductive structure 170 is located on the redistribution layer 150 that is in the opening 162 of the passivation layer 160. The conductive structure 170 protrudes outward from the passivation layer 160 to be electrically connected to the printed circuit board 180.

The chip 110 may be made of a material including silicon, such as a semiconductor chip. The redistribution layer 150 may be made of a material including aluminum. The passivation layer 160 may be made of a material including epoxy, such as a solder mask. The conductive structure 170 may be a solder ball of a ball grid array (BGA) or a conductive bump, and the present invention is not limited to the shape and the material of the conductive structure 170. The protection cap 140 may be made of a material including glass, aluminum nitride, tape, or sapphire to protect the side surface 116 of the chip 110 and the first surface 112 that has the sensing area 111.

It is to be noted that the connection relationships and materials of the elements described above will not be repeated in the following description, and aspects related to a manufacturing method of the chip package 100 will be described.

Figure 2:
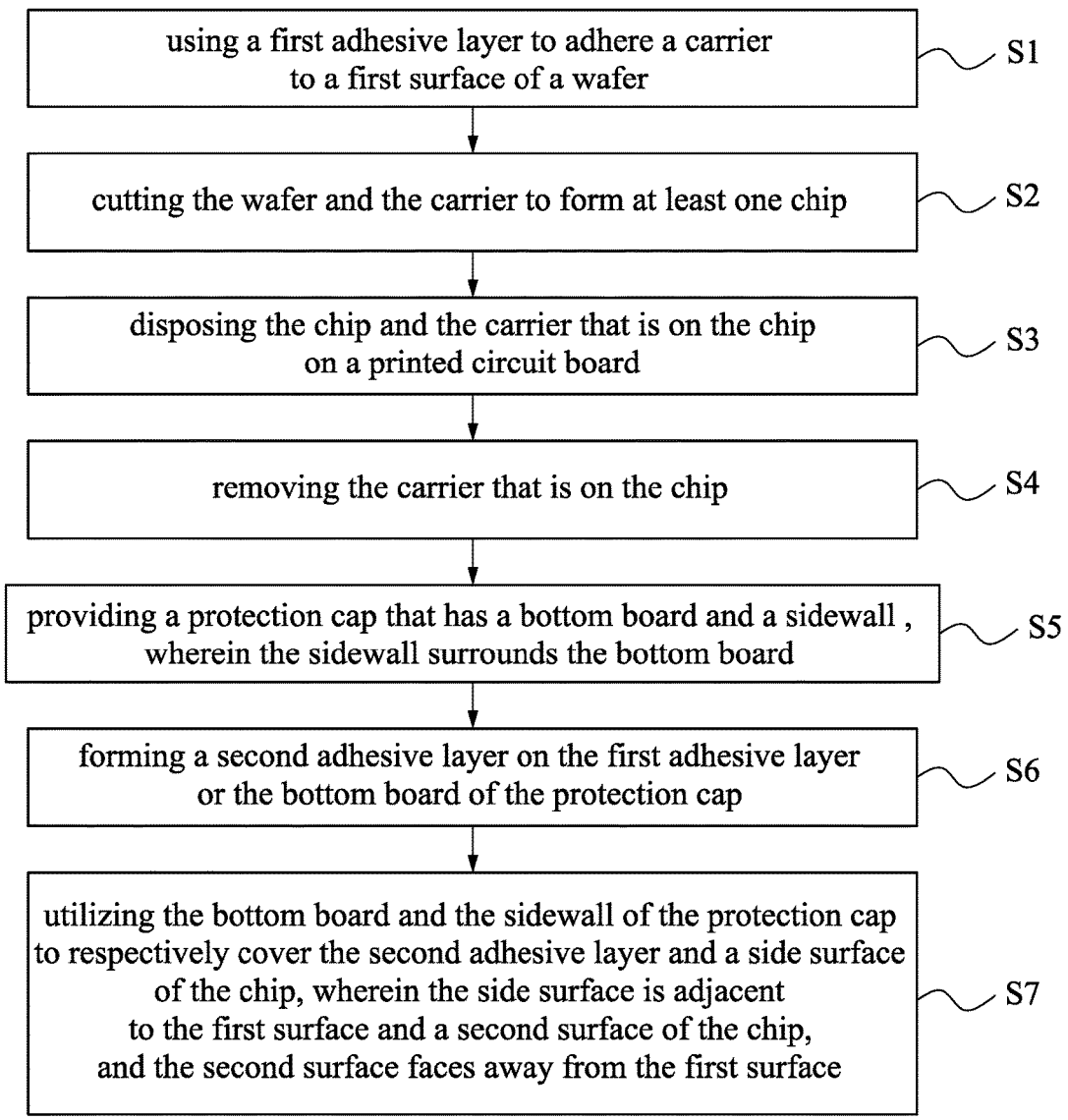
FIG. 2 is a flow chart of a manufacturing method of a chip package according to one embodiment of the present invention.

FIG. 2 is a flow chart of a manufacturing method of a chip package according to one embodiment of the present invention. The manufacturing method of the chip package includes the following steps. In step S1, a first adhesive layer is used to adhere a carrier to a first surface of a wafer. Thereafter, in step S2, the wafer and the carrier are cut to form at least one chip. Next, in step S3, the chip and the carrier that is on the chip are disposed on a printed circuit board. Afterwards, in step S4, the carrier that is on the chip is removed. Subsequently, in step S5, a protection cap having a bottom board and a sidewall is provided, and the sidewall surrounds the bottom board. Thereafter, in step S6, a second adhesive layer is formed on the first adhesive layer or the bottom board of the protection cap. Finally, in step S7, the bottom board and the sidewall of the protection cap are utilized to respectively cover the second adhesive layer and a side surface of the chip, and the side surface is adjacent to the first surface and a second surface of the chip, and the second surface faces away from the first surface. In the following description, the aforementioned steps will be explained in detail.

Figure 3:
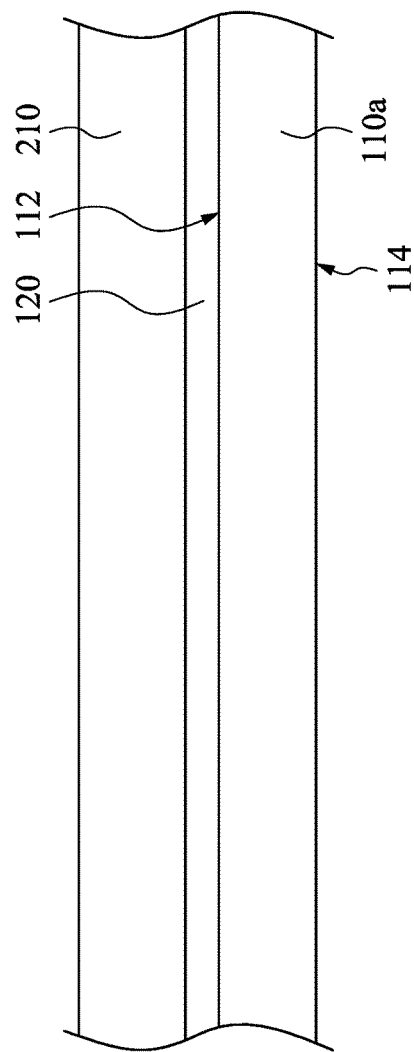
FIG. 3 is a cross-sectional view of a carrier after being adhered to a wafer according to one embodiment of the present invention.
Figure 4:
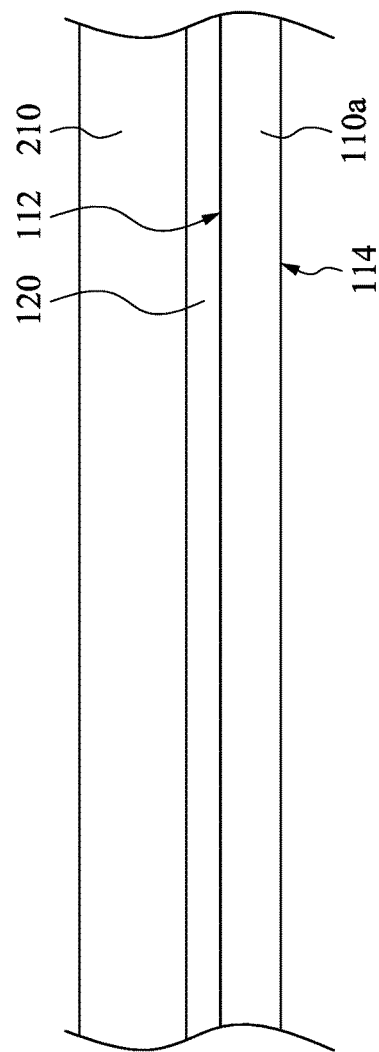
FIG. 4 is a cross-sectional view of the wafer shown in FIG. 3 after being ground.

FIG. 3 is a cross-sectional view of a carrier 210 after being adhered to a wafer 110a according to one embodiment of the present invention. FIG. 4 is a cross-sectional view of the wafer 110a shown in FIG. 3 after being ground. The wafer 110a is referred to as a semiconductor structure that can be diced to form at least one chip 110 of FIG. 1. As shown in FIG. 3 and FIG. 4, after the carrier 210 is adhered to the first surface 112 of the wafer 110a through the first adhesive layer 120, the second surface 114 of the wafer 110a may be ground to reduce the thickness of the wafer 110a. The carrier 210 may provide a supporting force to the ground wafer 110a. The carrier 210 may be made of a material including glass, but the present invention is not limited in this regard.

Figure 5:
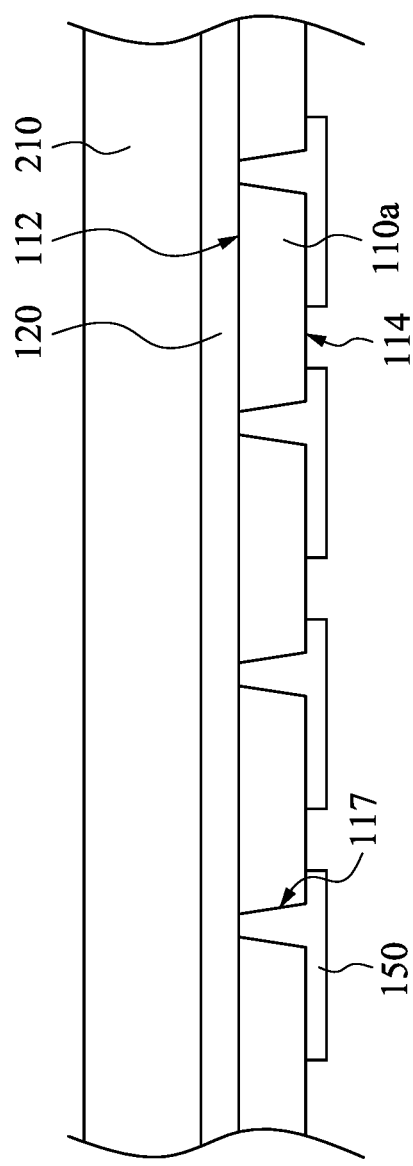
FIG. 5 is a cross-sectional view of a through hole and a redistribution layer after being respectively formed in and on the wafer shown in FIG. 4.

FIG. 5 is a cross-sectional view of the through hole 117 and the redistribution layer 150 after being respectively formed in and on the wafer 110a shown in FIG. 4. As shown in FIG. 4 and FIG. 5, after the wafer 110a is ground, the through hole 117 may be formed in the second surface 114 of the wafer 110a. Thereafter, a patterned redistribution layer 150 may be formed in the through hole 117 and on the second surface 114 of the wafer 110a. A "patterned" layer may be referred to as a layer that is applied by development, exposure, and etching processes in photolithography, or by an electroplating process, and the present invention is not limited in this regard.

Figure 6:
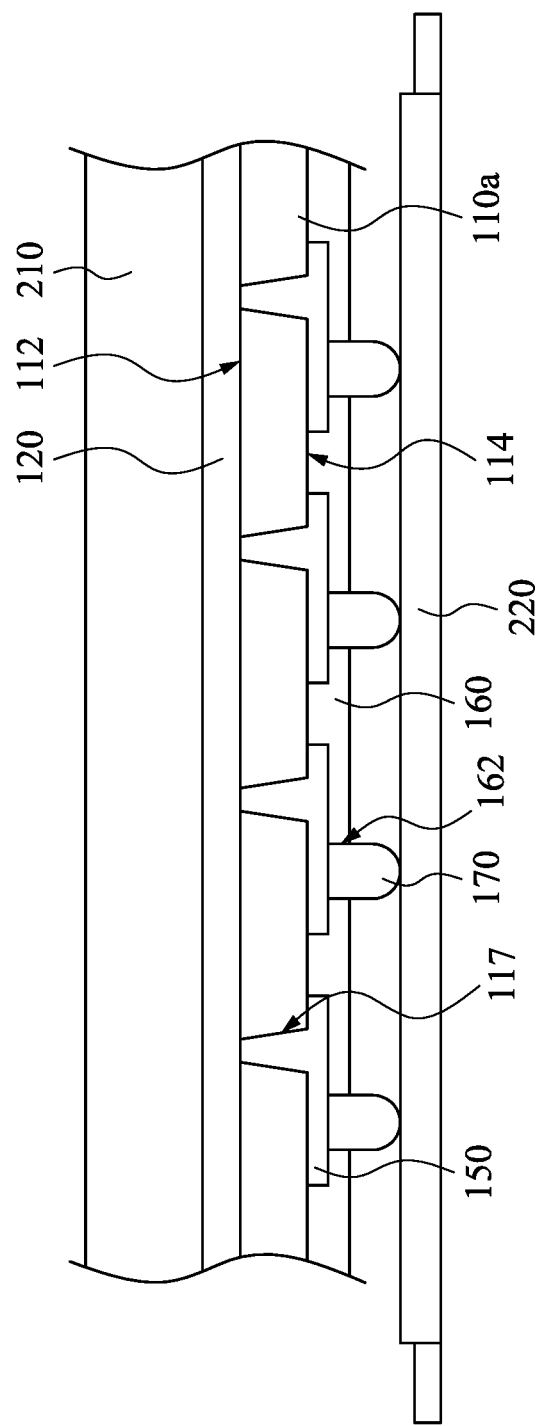
FIG. 6 is a cross-sectional view of a passivation layer and a conductive structure after being formed on the structure shown in FIG. 5, in which the structure is adhered to a protection tape.

FIG. 6 is a cross-sectional view of the passivation layer 160 and the conductive structure 170 after being formed on the structure shown in FIG. 5, in which the structure is adhered to a protection tape 220. As shown in FIG. 5 and FIG. 6, after the redistribution layer 150 is formed, the passivation layer 160 may be formed on the redistribution layer 150 and the second surface 114 of the wafer 110a. After that, the passivation layer 160 may be patterned, such that the passivation layer 160 has the opening 162 to expose a portion of the redistribution layer 150. Thereafter, the conductive structure 170 may be formed on the redistribution layer 150 that is in the opening 162 of the passivation layer 160.

After the conductive structure 170 is formed, the conductive structure 170 may be adhered to the protection tape 220 for the protection of the conductive structure 170.

Figure 7:
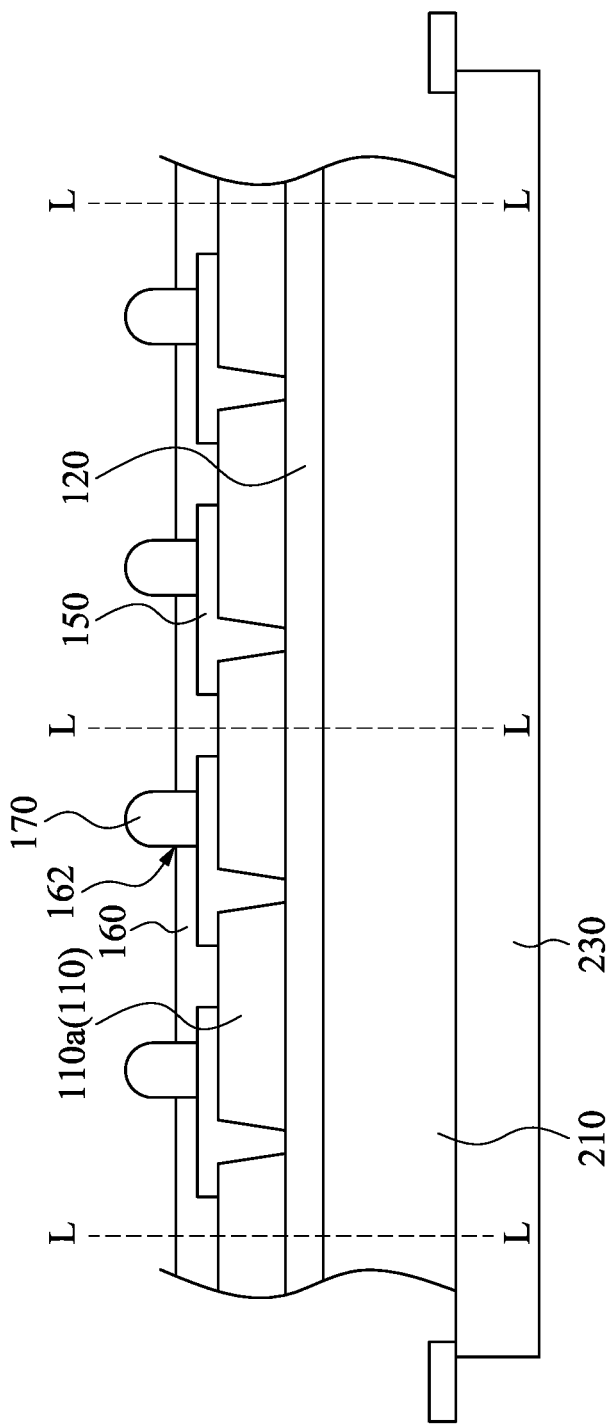
FIG. 7 is a cross-sectional view of a dicing tape after being adhered to the structure shown in FIG. 6, in which the protection tape is removed.

FIG. 7 is a cross-sectional view of a dicing tape 230 after being adhered to the structure shown in FIG. 6, in which the protection tape 220 is removed. As shown in FIG. 6 and FIG. 7, before a cutting (dicing) process, the carrier 210 of the structure shown in FIG. 6 may be adhered to the dicing tape 230, and then the protection tape 220 adhered to the conductive structure 170 may be removed. In the state of FIG. 7, the wafer 110a and the carrier 210 may be cut along line L-L to form at least one chip 110. In this embodiment, when cutting (dicing) the wafer 110a and the carrier 210, the wafer 110a and the carrier 210 are cut on the dicing tape 230. After the wafer 110a and the carrier 210 are cut, the chip 110 and the carrier 210 that is on the chip 110 may be extracted from the dicing tape 230.

Figure 8:
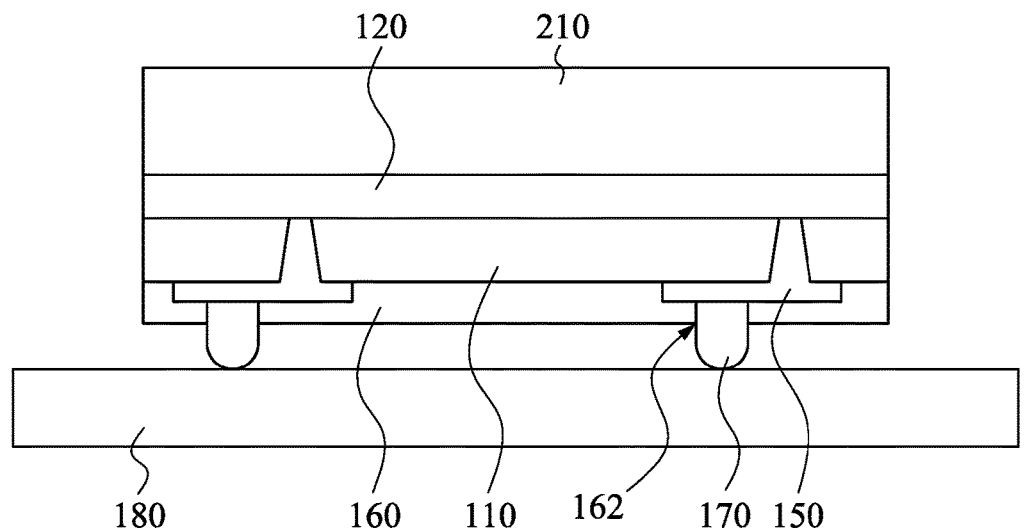
FIG. 8 is a cross-sectional view of the structure shown in FIG. 7 after the wafer and the carrier are cut, in which the structure is disposed on a printed circuit board.
Figure 9:
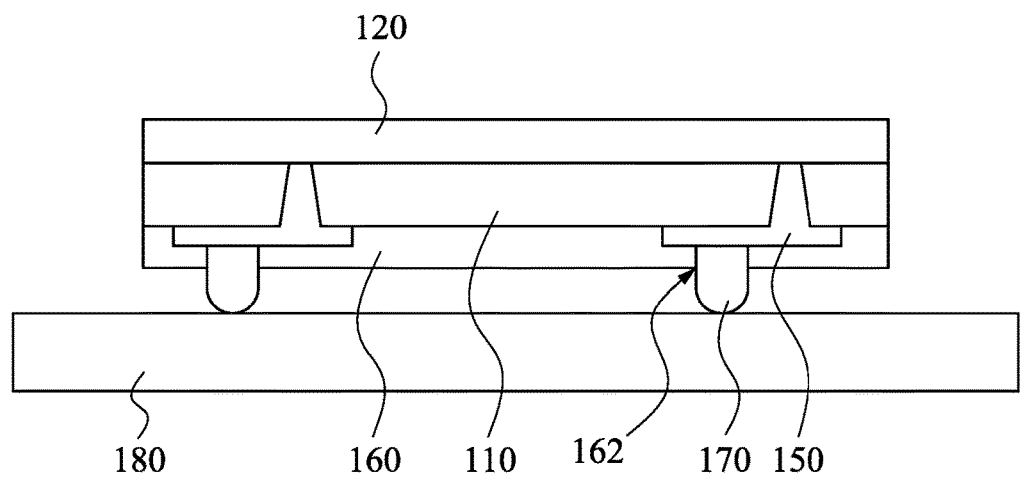
FIG. 9 is a cross-sectional view of the structure shown in FIG. 8 after the carrier is removed.

FIG. 8 is a cross-sectional view of the structure shown in FIG. 7 after the wafer 110a and the carrier 210 are cut, in which the structure is disposed on the printed circuit board 180. FIG. 9 is a cross-sectional view of the structure shown in FIG. 8 after the carrier 210 is removed. As shown in FIG. 8 and FIG. 9, after the chip 110 is extracted from the dicing tape 230 (see FIG. 7), the chip 110 and the carrier 210 that is on the chip 110 may be disposed on the printed circuit board 180. Thereafter, the carrier 210 on the chip 110 may be removed. In other words, the first adhesive layer 120 is utilized to temporarily bond the carrier 210 to the wafer 110a or the chip 110.

Figure 10:
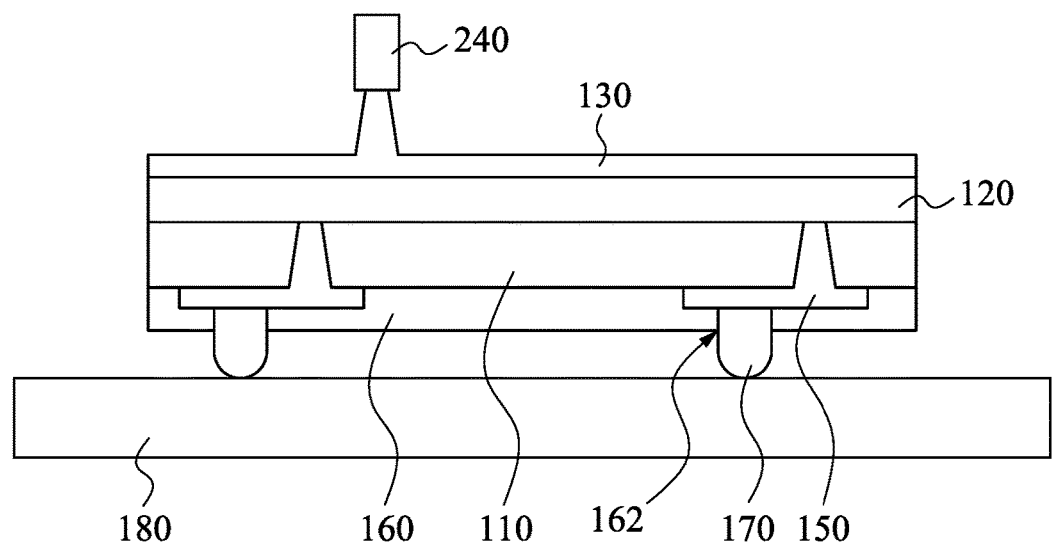
FIG. 10 is a cross-sectional view of a second adhesive layer after being formed on a first adhesive layer shown in FIG. 9.

FIG. 10 is a cross-sectional view of the second adhesive layer 130 after being formed on the first adhesive layer 120 shown in FIG. 9. As shown in FIG. 1 and FIG. 10, after the carrier 210 on the chip 110 is removed, the protection cap 140 having the bottom board 142 and the sidewall 144 may be provided. Afterwards, the second adhesive layer 130 may be formed on the first adhesive layer 120. The second adhesive layer 130 may be formed on the first adhesive layer 120 by dispensing or printing through a nozzle 240. After the second adhesive layer 130 is formed, the bottom board 142 and the sidewall 144 of the protection cap 140 may be utilized to respectively cover the second adhesive layer 130 and the side surface 116 of the chip 110. The protection cap 140 is fixed on the chip 110 through the second adhesive layer 130, thereby obtaining the chip package 100 of FIG. 1. In the following description, another method for fixing the protection cap 140 on the chip 110 will be described.

Figure 11:
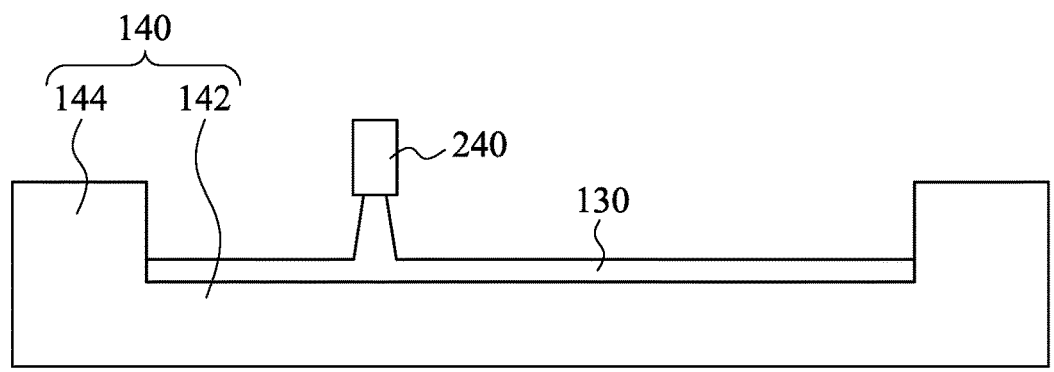
FIG. 11 is a cross-sectional view of a second adhesive layer after being formed on a bottom board of a protection cap according to one embodiment of the present invention.

FIG. 11 is a cross-sectional view of the second adhesive layer 130 after being formed on the bottom board 142 of the protection cap 140 according to one embodiment of the present invention. As shown in FIG. 1 and FIG. 11, after the carrier 210 on the chip 110 is removed, the protection cap 140 having the bottom board 142 and the sidewall 144 may be provided. Thereafter, the second adhesive layer 130 may be formed on the bottom board 142 of the protection cap 140. Similarly, the second adhesive layer 130 may be formed on the bottom board 142 of the protection cap 140 by dispensing or printing through the nozzle 240. After the second adhesive layer 130 is formed, the bottom board 142 and the sidewall 144 of the protection cap 140 may be utilized to respectively cover the second adhesive layer 130 and the side surface 116 of the chip 110. As a result, the protection cap 140 may be fixed on the chip 110 through the second adhesive layer 130.

In manufacturing the chip package 100, since the first surface 112 of the wafer 110a (see FIGS. 3 to 6) is adhered to the carrier 210 (see FIGS. 3 to 8) through the first adhesive layer 120, even if the wafer 110a is thin, the thin wafer 110a is not limited by process limitations which may cause difficulty for a thin wafer to move, and a warpage issue is not prone to occur. In addition, before the chip 100 is disposed on the printed circuit board 180 in the manufacturing method of the chip package 100, the carrier 210 is temporarily disposed on the wafer 110a or on the chip 100 that is formed by cutting (dicing) the wafer 110a, such that the sensing area 111 of the chip 110 is not easily polluted during manufacturing processes, thereby improving product yield.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising:
   a chip having a sensing area, a first surface, a second surface that is opposite to the first surface, a side surface that is adjacent to the first and second surfaces, and a through hole that is between the first and second surfaces, wherein the sensing area is located on the first surface;
   a redistribution layer located in the through hole and extending to the second surface of the chip;
   a first adhesive layer covering the first surface of the chip;
   a second adhesive layer located on the first adhesive layer, such that the first adhesive layer is between the first surface of the chip and the second adhesive layer; and
   a protection cap having a bottom board and a sidewall that surrounds the bottom board, wherein the bottom board covers the second adhesive layer, and the sidewall covers the side surface of the chip.

2. The chip package of claim 1, further comprising:
   a passivation layer located on the redistribution layer and the second surface of the chip, and having an opening to expose a portion of the redistribution layer.

3. The chip package of claim 2, further comprising:
   a conductive structure located on the redistribution layer that is in the opening, and protruding outward from the passivation layer.

4. The chip package of claim 3, wherein the conductive structure is a solder ball or a conductive bump.

5. The chip package of claim 1, wherein the protection cap is made of a material comprising glass, aluminum nitride, tape, or sapphire.

6. A manufacturing method of a chip package, comprising:
   (a) using a first adhesive layer to adhere a carrier to a first surface of a wafer;
   (b) cutting the wafer and the carrier to form at least one chip;

(c) disposing the chip and the carrier that is on the chip on a printed circuit board;

(d) removing the carrier that is on the chip;

(e) providing a protection cap that has a bottom board and a sidewall, wherein the sidewall surrounds the bottom board;

(f) forming a second adhesive layer on the first adhesive layer or the bottom board of the protection cap; and (g) utilizing the bottom board and the sidewall of the protection cap to respectively cover the second adhesive layer and a side surface of the chip, wherein the side surface is adjacent to the first surface and a second surface of the chip, and the second surface faces away from the first surface.

7. The manufacturing method of claim 6, further comprising:

grinding the second surface of the wafer.

8. The manufacturing method of claim 6, further comprising:

forming a through hole in the second surface of the wafer.

9. The manufacturing method of claim 8, further comprising:

forming a patterned redistribution layer in the through hole and on the second surface of the wafer.

10. The manufacturing method of claim 9, further comprising:

forming a passivation layer on the redistribution layer and the second surface of the wafer; and pattering the passivation layer, such that the passivation layer has an opening to expose a portion of the redistribution layer.

11. The manufacturing method of claim 10, further comprising:

forming a conductive structure on the redistribution layer that is in the opening of the passivation layer.

12. The manufacturing method of claim 11, further comprising:

adhering the conductive structure to a protection tape.

13. The manufacturing method of claim 12, further comprising:

adhering the carrier to a dicing tape; and removing the protection tape.

14. The manufacturing method of claim 13, wherein step (b) comprises:

cutting the wafer and the carrier on the dicing tape; and extracting the chip and the carrier that is on the chip from the dicing tape after the wafer and the carrier is cut.

15. The manufacturing method of claim 6, wherein step (f) comprises:

dispensing the second adhesive layer to the first adhesive layer or the bottom board of the protection cap.

16. The manufacturing method of claim 6, wherein step (f) comprises:

printing the second adhesive layer on the first adhesive layer or the bottom board of the protection cap.

* * * * *